United States Patent [19]

Johnson

[11] Patent Number: 4,475,284

[45] Date of Patent: Oct. 9, 1984

[54] CONTACT PIN ASSEMBLY TOOL

[75] Inventor: Lennart B. Johnson, Milford, N.H.

[73] Assignee: Teradyne, Inc., Boston, Mass.

[21] Appl. No.: 384,188

[22] Filed: Jun. 3, 1982

[51] Int. Cl.³ .......................... H05K 3/30; H01R 43/00

[52] U.S. Cl. .......................................... 29/739; 29/747; 29/758; 29/838; 29/881

[58] Field of Search .................. 29/739, 747, 758, 741, 29/837–839, 842, 844, 845, 881, 884

[56] References Cited

U.S. PATENT DOCUMENTS

| | | | |
|---|---|---|---|
| 4,089,104 | 5/1978 | Barry et al. | 29/739 X |
| 4,316,321 | 2/1982 | Wickham | 29/845 |
| 4,380,118 | 4/1983 | Driver et al. | 29/747 |
| 4,383,361 | 5/1983 | Kantz | 29/739 |

FOREIGN PATENT DOCUMENTS

| | | | |
|---|---|---|---|
| 678621 | 1/1964 | Canada | 29/844 |

*Primary Examiner*—Carl E. Hall

[57] ABSTRACT

A pronged electrical contact is inserted into a circuit board by a tool with a cavity that is partially defined by upwardly converging inner surfaces shaped to mate with upwardly converging outer surfaces of the prongs.

6 Claims, 1 Drawing Figure

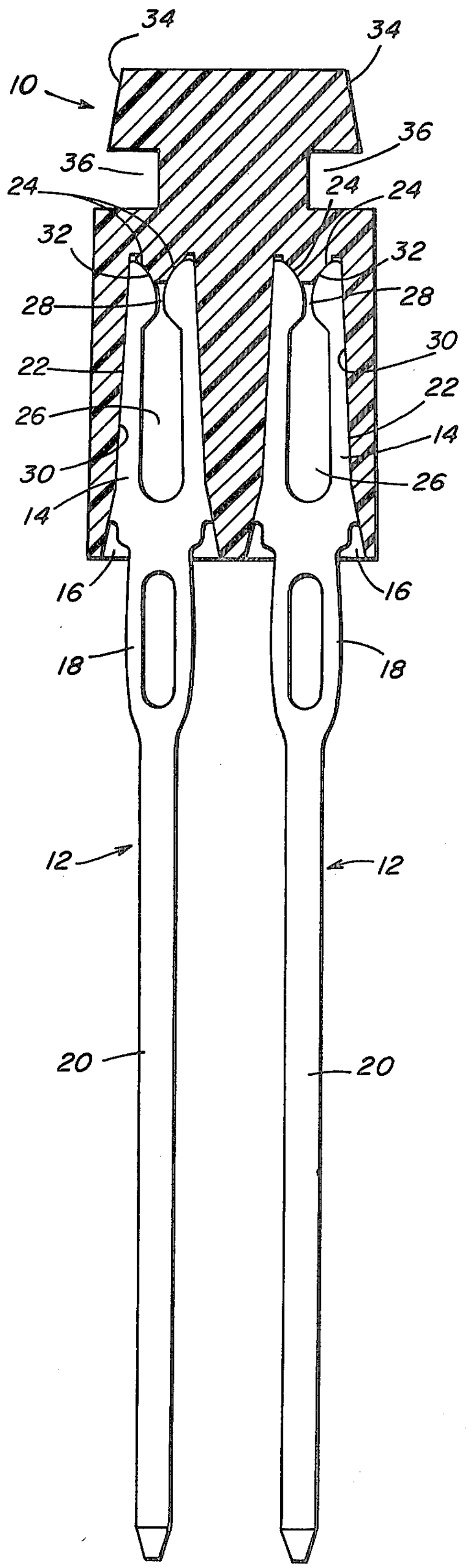
34
34
10
36
36
24
24
24
32
32
28
28
30
22
22
26
14
30
26
14
16
16
18
18
12
12
20
20

CONTACT PIN ASSEMBLY TOOL

FIELD OF THE INVENTION

The invention relates to tools for inserting contacts into circuit board holes.

BACKGROUND OF THE INVENTION

Contacts with paired prongs are often inserted into plated-through holes of printed circuit boards, to provide electrical communication between the board and blades inserted between the prongs. Because a 15-40 pound force is typically required to push each contact into its respective hole, and because the contacts are very small, care must be taken when inserting the contacts to prevent buckling or other damage to the contacts. In one tool used to insert such a contact, insertion forces are transmitted to the contact via a metal blade inserted between the prongs.

SUMMARY OF THE INVENTION

It has been discovered that pronged contacts can be advantageously inserted into holes in a circuit board via a tool having a cavity partially defined by upwardly converging inner surfaces shaped to mate with the upwardly converging outer surfaces of the prongs. In preferred embodiments the cavity is also partially defined at its top by upwardly diverging surfaces shaped to mate with upwardly diverging inner surfaces of opposing prongs; the tool is made of plastic material; and the tool is provided with an upper portion that has an upwardly converging surface above a cutout portion to facilitate removal of the tool from the contact after insertion.

DESCRIPTION OF THE PREFERRED EMBODIMENT

The structure and use of the presently preferred embodiment of the invention will now be described after first briefly describing the drawing, which is a vertical sectional view of a contact insertion tool engaging two contacts.

STRUCTURE

Referring to the FIGURE of the drawing, there is shown tool 10 engaging contacts 12, whose prongs 14 are within cavities 16 of tool 10.

Contacts 12 have bow-shaped springs 18, which compress when mounted in holes in a printed circuit board (PCB) in use, and elongated portions 20, which extend below the PCB in use. Prongs 14 have upwardly converging outer surfaces 22, and opposing, upwardly diverging inner surfaces 24, for guiding blades into region 26 between prongs 14. Portions of surfaces 24 near gap 28, the narrowest portion between opposing surfaces 24, are plated with gold to provide good electrical contact, and nearby inner and outer surfaces of approximately the upper one third of each prong 14 are plated with gold, to resist corrosion. Elongated portions 20 have square cross sections, and contacts 12 have uniform thickness in a direction perpendicular to the plane through which the section is taken.

Tool 10 is made of glass-reinforced plastic. Cavity 16 is partially defined by upwardly converging surfaces 30, that are shaped to mate with outer contact surfaces 22, and upwardly diverging surfaces 32, that are shaped to mate with inner contact surfaces 24. Cavity 16 has, in a direction perpendicular to the plane through which the section is taken, a dimension that is sufficiently close to that of the thickness of contacts 12 to provide a snug fit. At the top of tool 10 are upwardly converging surfaces 34 and cutout portions 36.

OPERATION

Contacts 12 are inserted into cavities 16 of tool 10, and prongs 14 are held in tool 10 against surfaces 30 by the spring force of the prongs, and can be stored indefinitely prior to shipment or use, because tool 10 provides a safe environment.

When loading a PCB, tool 10 is easily engaged by a press machine (not shown) that slides over upwardly converging surfaces 34, and elongated portions 20 are inserted into holes in the PCB (not shown). The downward insertion forces applied to tool 10 are transmitted from tool surfaces 30 to mating prong surfaces 22 and from tool surfaces 32 to mating prong surfaces 24. If prongs 14 start to bend, they move inward and touch and are thereby prevented from buckling. Tool 10 is removed when the press machine engages horizontal surfaces of cutout portions 36 to pull tool 10 upward.

Tool 10 provides good alignment between contacts 12, owing to the mating surfaces and snug fit, and the plastic material does not wear down the gold plating on the prongs.

OTHER EMBODIMENTS

Other embodiments of the invention within the scope of the appended claims will become apparent to those in the art. For example, although only two contacts are shown, tool 10 can have two or more rows of recesses 16 for such contacts.

What is claimed is:

1. A tool for inserting a forked contact having prongs with upwardly converging outer surfaces and inwardly directed contact surfaces into an aperture in a circuit board, said tool comprising a body with a cavity for receiving said prongs, said cavity being partially defined by upwardly converging inner surfaces shaped to mate with said upwardly converging outer surfaces of said prongs to prevent said prongs from bending outwardly from each other and being damaged during insertion of said contact into a circuit board, said cavity also being defined by insertion force bearing surfaces for transmitting insertion forces to upper portions of said prongs, said cavity being open between said prongs below said contact surfaces.

2. The tool of claim 1 wherein said contact prongs include upwardly diverging inner surfaces, and wherein said insertion force bearing surfaces comprise upwardly diverging surfaces shaped to mate with said upwardly diverging inner surfaces of said prongs.

3. The tool of claim 2 wherein said body is made of plastic material.

4. The tool of claim 1 wherein said body has an upper portion with an upwardly converging surface above a cut-out portion, to facilitate removal of the tool from the contact.

5. The tool of claim 1 wherein there are a plurality of said cavities.

6. A tool for inserting a forked contact having prongs with outer surfaces and inwardly directed contact surfaces into an aperture in a circuit board, said tool comprising a body with a cavity for receiving said prongs, said cavity being partially defined by inner surfaces shaped to mate with said outer surfaces of said prongs to prevent said prongs from bending outwardly from each other and being damaged during insertion into a circuit board, said cavity also being defined by insertion force bearing surfaces for transmitting insertion forces to upper portions of said prongs, said cavity being open between said prongs below said contact surfaces.

* * * * *